(12) United States Patent
Tachibana et al.

(10) Patent No.: US 7,892,411 B2
(45) Date of Patent: *Feb. 22, 2011

(54) ELECTROLYTIC COPPER PLATING PROCESS

(75) Inventors: Shinji Tachibana, Hirakata (JP); Tomohiro Kawase, Hirakata (JP); Naoyuki Omura, Hirakata (JP); Toshihisa Isono, Hirakata (JP); Koji Shimizu, Hirakata (JP)

(73) Assignee: C. Uyemura & Co., Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/187,918

(22) Filed: Aug. 7, 2008

(65) Prior Publication Data

US 2009/0038952 A1    Feb. 12, 2009

(30) Foreign Application Priority Data

Aug. 9, 2007    (JP) .............................. 2007-207440

(51) Int. Cl.
*C25D 21/18* (2006.01)
*C25D 3/38* (2006.01)

(52) U.S. Cl. ........................ 205/101; 205/291; 205/296

(58) Field of Classification Search ................. 205/101, 205/291, 296

See application file for complete search history.

(56) References Cited

U.S. PATENT DOCUMENTS

| | | | | |
|---|---|---|---|---|
| 4,401,522 A | * | 8/1983 | Buschow et al. | ............ 205/145 |
| 5,143,593 A | * | 9/1992 | Ueno et al. | .................. 205/291 |
| 6,350,362 B1 | * | 2/2002 | Geisler et al. | ................ 205/101 |
| 6,835,294 B2 | | 12/2004 | Tsuchida et al. | |
| 2009/0026083 A1 | * | 1/2009 | Tachibana et al. | ........... 205/101 |

FOREIGN PATENT DOCUMENTS

| | | |
|---|---|---|
| JP | 3-97887 A | 4/1991 |
| JP | 2003-55800 A | 2/2003 |
| JP | 2003-166100 | 6/2003 |
| JP | 2004-143478 A | 5/2004 |
| JP | 2005-187869 A | 7/2005 |
| JP | 2005187869 A * | 7/2005 |

\* cited by examiner

*Primary Examiner*—Edna Wong
(74) *Attorney, Agent, or Firm*—Birch, Stewart, Kolasch & Birch, LLP

(57) ABSTRACT

Disclosed herein is an electrolytic copper plating process for electroplating copper on workpieces in a copper sulfate plating bath filled in a plating tank and containing an organic additive while using a soluble anode or insoluble anode as an anode and the workpieces as cathodes, including the steps of, setting a bath current density at not higher than 5 A/L, immersing metal copper in a region of the copper sulfate plating bath, the region being apart from a region between the anode and the cathode and also from regions adjacent the anode and cathode, respectively, such that a neighborhood of the thus-immersed metal copper can be used as an oxidative decomposition region, setting an immersed area of the metal copper at not smaller than 0.001 dm$^2$/L based on the plating bath, and applying air bubbling to the oxidative decomposition region at not lower than 0.01 L/dm$^2$·min based on the immersed area.

4 Claims, 4 Drawing Sheets

ELECTROLYTIC COPPER PLATING PROCESS

CROSS-REFERENCE TO RELATED APPLICATION

This non-provisional application claims priority under 35 U.S.C. §119(a) on Patent Application No. 2007-207440 filed in Japan on Aug. 9, 2007, the entire contents of which are hereby incorporated by reference.

BACKGROUND OF THE INVENTION

1. Field of the Invention

This invention relates to a process for electrolytically copper-plating workpieces in a copper sulfate plating bath.

2. Description of the Related Art

Upon forming a pattern on printed circuit boards or wafers, copper sulfate electroplating is applied using an insoluble anode or soluble anode. In a copper sulfate plating bath for the printed circuit boards or wafers, organic additives called a "brightener", "leveler", "promoter", "inhibitor" and/or the like are contained. It is, however, known that in the course of continuous plating, these organic additives may be decomposed or modified to result in a failure in obtaining copper plating films or copper plating fills as desired. This failure is considered to be attributable to decompositions or modifications of the organic additives while oxidation and reduction reactions are repeated at an anode and a cathode in the plating (the thus-decomposed or modified compounds may hereinafter be also called "decomposed/modified organic products"). As art related to copper sulfate electroplating, the following related art can be mentioned, for example.

Japanese Patent Laid-open No. Hei 3-97887 discloses a technique to replenish copper ions to a copper sulfate plating bath, air agitation is performed in a separate tank with unpowered copper metal arranged therein such that the metal copper is dissolved. This patent document, however, makes no mention about a measure for the problem of decomposed/modified organic products.

To solve the above-described problem of organic additives, the following related art has been proposed, for example.

Japanese Patent Laid-open No. 2003-55800 discloses a technique in which dummy plating is performed in a separate tank while using an insoluble anode, such that with oxygen produced from the insoluble anode, decomposed/modified organic products are oxidatively decomposed to lower their content. When plating is continuously performed, however, it takes an unduly long time for the full oxidative decomposition of decomposed/modified organic products. This technology is, therefore, not suited for practical use.

Japanese Patent Laid-open No. 2004-143478 discloses a technique in which air agitation is performed in a separate tank to raise the quantity of dissolved oxygen in a copper sulfate plating bath, such that with the dissolved oxygen, decomposed/modified organic products are oxidatively decomposed. With air agitation alone, however, the oxidative decomposition of decomposed/modified organic products is insufficient. To overcome this problem, it may be contemplated to intensify the air agitation. However, stronger air agitation result in more return of large bubbles to the plating bath. When such large bubbles mix into the plating tank, they adhere to workpieces and cause plating defects such as bare spots. Further, the dissolved oxygen in the plating bath also decomposes organic additives as mentioned above. An excessive increase in the quantity of dissolved oxygen in the plating bath, therefore, leads to greater formation of undesired organic substances. As a consequence, defective copper plating fill and/or defective plating films is induced, and moreover, more organic additives have to be replenished. This technology is, therefore, uneconomical.

Japanese Patent Laid-open No. 2005-187869 discloses to arrange unpowered metal copper in a separate tank and to apply air agitation to the metal copper such that decomposed/modified organic products are decomposed. This technology is, however, uneconomical because a great deal of metal copper has to be arranged to effect the decomposition. In addition, this technology applies air agitation to the metal copper, and therefore, is accompanied by the same problem as the above-described technology of Japanese Patent Laid-open No. 2004-143478.

SUMMARY OF THE INVENTION

With the foregoing circumstances in view, the present invention has as an object thereof the provision of an electrolytic copper plating process, which upon applying electrolytic copper plating to workpieces having structural features to be filled with copper plating such as printed circuit boards or wafers having blind vias and/or trenches, can perform efficient oxidative decomposition of decomposed/modified organic products to be formed as a result of oxidation or reduction of organic additives in the course of continuous electroplating in a copper sulfate plating bath, can reduce, to a practical minimum level, defective copper plating, voids and the like to be caused by the decomposed/modified organic products, and can stably perform plating over a long term while maintaining high productivity.

The present inventor has enthusiastically conducted an investigation to overcome the above-described problems. As a result, it was found that the amount of decomposed/modified organic products of organic additives basically tend to increase with the bath current density (A/L), and it was also found control in a plating tank is effective against effects of the decomposed/modified organic products on plating. It was then found that by controlling the environment inside a plating tank in which electrolytic copper plating is being performed, specifically by immersing metal copper in an unpowered state in a copper sulfate plating bath in the same tank as a plating tank with an anode and cathodes (workpieces) immersed therein, applying air bubbling to the metal copper, and upon application of the air bubbling, controlling the rate of the air bubbling at a predetermined level such that decomposed/modified organic products in the copper sulfate plating bath in the plating tank are efficiently subjected to oxidative decomposition while maintaining a predetermined plating rate, defective copper plating fill, voids and the like to be caused by such decomposed/modified organic products can be reduced to a practical minimum level and plating can be stably performed over a long term, leading to the completion of the present invention.

In one aspect, the invention provides an electrolytic copper plating process for electroplating copper on workpieces in a copper sulfate plating bath filled in a plating tank and containing an organic additive while using a soluble anode or insoluble anode as an anode and the workpieces as cathodes, including the steps of:

setting a bath current density at not higher than 5 A/L;

immersing metal copper in a region of the copper sulfate plating bath, said region being apart from a region between the anode and the cathode and also from regions adjacent the anode and cathode, respectively, such that a neighborhood of the thus-immersed metal copper can be used as an oxidative decomposition region;

setting an immersed area of the metal copper at not smaller than 0.001 dm$^2$/L based on the plating bath; and applying air bubbling to the oxidative decomposition region at not lower than 0.01 L/dm$^2$·min based on the immersed area;

whereby the electroplating is performed while dissolving the metal copper as copper ions and also while subjecting on a surface of the metal copper a decomposed/modified organic product, which has been formed as a result of decomposition or modification by an oxidation or reduction reaction of the organic additive upon the electrolytic copper plating, to oxidative decomposition by a non-electrolytic oxidizing action independent from a current impressed between the anode and the cathode.

In one preferred embodiment, the organic additive is at least one organic compound selected from a nitrogen-containing organic compound, a sulfur-containing organic compound or an oxygen-containing organic compound.

In other preferred embodiment, the metal copper is surrounded and isolated by an anti-spreading means for air bubbles such that the plating bath is movable both inside and outside the anti-spreading means for air bubbles, and the air bubbling is applied to the inside surrounded by the anti-spreading means for air bubbles.

In other preferred embodiment, a separate tank is arranged in addition to the plating tank, copper ions required for the plating are fed to the separate tank, and the copper ions are replenished from the separate tank into the plating tank.

When workpieces having structural features to be filled with copper plating to form wirings (including interlayer connection wirings), such as printed circuit boards or wafers having blind vias, trenches and/or interposer holes, are continuously electroplated using a copper sulfate plating bath, organic substances (decomposed/modified organic products) are considered to occur as a result of oxidation or reduction of organic additives as described above. According to the present invention, these decomposed/modified organic products can be efficiently subjected to oxidative decomposition, thereby making it possible to reduce defective copper plating fill, voids and the like, which are to be caused by such decomposed/modified organic products, to a practical minimum level and also to stably perform electrolytic copper plating over a long term without stopping a plating line.

BRIEF DESCRIPTION OF THE DRAWINGS

The above and other features and advantages of the invention will be more fully understood by reading the following description, taken in conjunction with the accompanying drawings.

FIGS. 1A and 1B illustrate examples of means for immersing metal copper in a plating bath, in which FIG. 1A is a perspective view of a metal copper receptacle with metal copper contained therein and FIG. 1B is a perspective view of an oxidative decomposition unit in which metal copper receptacles, air nozzles and anti-spreading means for air bubbles are integrated together.

DETAILED DESCRIPTION OF THE PREFERRED EMBODIMENTS

Figure 1A:
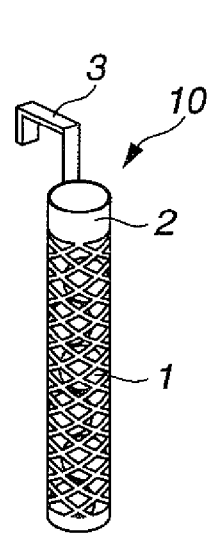

The present invention will hereinafter be described in detail. The electrolytic copper plating process according to the present invention is effective in electrolytic copper plating that continuously performs electrolytic copper plating on workpieces in a copper sulfate bath, which contains one or more organic additives, under conditions that the bath current density is controlled at 5 A/L or lower (exclusive of 0 A/L), preferably at 0.001 to 1 A/L, more notably at 0.01 to 0.3 A/L. The term "bath current density" means the total quantity of a current applied to every liter of a copper sulfate plating bath held in a plating bath (including a main plating tank where electroplating is applied to workpieces and also an overflow tank) upon electrolytic copper plating. When the volume of a plating tank is 100 L, the cathode current density is 1 A/dm$^2$ and an area to be plated is 20 dm$^2$, for example, the bath current density is calculated to be 0.2 A/L. Control of the bath current density to the above-described range is effective in assuring sufficient plating fillability especially for blind vias.

For higher plating productivity, it is most effective to perform plating at a higher plating rate by increasing the bath current density. When the plating rate is increased, however, it has heretofore been unable to effectively decrease organic substances (decomposed/modified organic products) to be formed by oxidation or reduction of organic additives when electroplating is continuously performed using a copper sulfate plating bath. According to the present invention, decomposed/modified organic products in a plating bath can be decreased with high efficiency in electrolytic copper plating at such a high plating rate. The present invention, therefore, makes it possible to continuously perform electrolytic copper plating without developing defects on plating films or plating fills to be deposited, without causing reductions in required characteristics, and without stopping a plating line in a short time.

In the present invention, the copper sulfate plating bath contains an organic additive. Examples of the organic additive include organic additives called "brighteners", "levelers", "promoters", "inhibitors" and the like, which are commonly incorporated in electrolytic copper sulfate plating baths, that is, conventionally-known nitrogen-containing organic compounds, sulfur-containing organic compounds, oxygen-containing organic compounds and the like commonly incorporated in electrolytic copper sulfate plating baths.

Examples of organic additives and their concentrations in copper sulfate plating baths, which are usable in the present invention, will be described hereinafter. Preferred are, for example, 0.01 to 1,000 mg/L in the case of nitrogen-containing organic compounds such as tertiary amine compounds and quaternary ammonium compounds known in via filling plating or damascene; 0.001 to 100 mg/L in the case of sulfur-containing compounds, e.g., disulfides such as bis(3-sulfopropyl)disulfide (disodium salt) (SPS) and 3-mercapto-propane-1-sulfonic acid (sodium salt) (MPS) known in via filling plating or damascene; and 0.001 to 5,000 mg/L in the case of oxygen-containing organic compounds, e.g., polyether organic compounds such as polyethylene glycol known in via filling plating or damascene.

As the copper sulfate plating bath, on the other hand, one containing, for example, copper sulfate as copper sulfate pentahydrate at 30 to 300 g/L and sulfuric acid at 30 to 300 g/L can be used suitably. The copper sulfate plating bath may preferably contain chlorine ions (Cl—) at 5 to 200 mg/L. It is to be noted that the copper sulfate plating bath is generally used at a pH of two or lower (0 to 2).

In the present invention, a soluble anode or an insoluble anode (for example, an anode formed of titanium and coated with iridium oxide) is used as an anode, and using workpieces as cathodes, electrolytic copper plating is applied onto the workpieces. The cathode current density can be set generally at 0.1 to 10 $A/dm^2$, preferably at 0.3 to 3 $A/dm^2$, notably at 0.5 to 2 $A/dm^2$. During electrolytic copper plating, agitation such as jet flow agitation or circulation agitation may preferably be applied to the copper sulfate plating bath. Further, combined use of air agitation for the cathodes can be preferred. The jet flow agitation, circulation agitation or the like of the copper sulfate plating bath promotes the replacement of the plating bath in the vicinity of an oxidative decomposition unit to be described subsequently herein, and hence promotes the decomposition of decomposed/modified organic products. On the other hand, the combined use of air agitation for the cathodes is also preferred for the replacement of the plating bath at cathode surfaces to avoid plating defects.

In the copper sulfate plating bath in the plating bath (including the main plating tank with the anode and cathodes immersed therein) and the overflow tank), metal copper in an unpowered state is immersed such that the immersed area of the metal copper becomes 0.001 $dm^2/L$ or more, notably 0.01 to 1 $dm^2/L$ based on the volume of the plating bath (i.e., the volume of the plating bath held in the plating bath including the main plating tank and the overflow tank).

In this case, an electroplating current impressed between anode and cathodes is not applied to the metal copper so that the metal copper is immersed in an unpowered state (in other words, the metal copper is not a soluble anode). If the immersed area is smaller than 0.001 $dm^2/L$, decomposed/modified organic products formed as a result of decomposition or modification by oxidation or reduction reaction of the organic additive upon electrolytic copper plating accumulate even if the environment in the plating tank can be maintained at high plating efficiency. Accordingly, plating performance cannot be maintained, thereby failing to inhibit voids in plating films and defective plating fill. It is to be noted that the metal copper can be phosphorus-containing copper with phosphorus contained in a small amount (for example, 100 to 1,000 ppm or so) besides one called "oxygen-free copper" or "low-oxygen copper".

As a method for immersing the metal copper, use of metal copper in the form of small-diameter spheres (metal copper balls) is preferred to assure a certain immersed area although a method such as suspending a copper plate can also be adopted. Such metal copper balls may be held in a meshed receptacle formed of a material that undergoes neither dissolution or corrosion in the plating bath (for example, a material free from dissolution or corrosion in an unpowered immersed state, such as Ti or stainless steel), and may then be immersed together with the receptacle in the plating bath.

To this metal copper, air bubbling is applied. In this case, for the prevention of air bubbling for the metal copper from spreading to areas other than the neighborhood of the metal copper, the metal copper can be surrounded and isolated by anti-spreading means for air bubbles, such as a net-shaped (meshed), fabric-shaped or like bag formed of a material free from dissolution or corrosion in the plating bath (for example, a material free from dissolution or corrosion under conditions of pH 2 or lower, such as polypropylene or polyethylene), such that the plating bath is movable both inside and outside the anti-spreading means for air bubbles. In this case, it is preferred to arrange one or more air nozzles with air outlet or outlets thereof being located inside the anti-spreading means for air bubbles and to apply air bubbling to the inside surrounded by the anti-spreading means for air bubbles. The above-described arrangement of one or more air nozzles makes it possible to confine air bubbling for the metal copper to a predetermined small zone and to form a localized oxygen-saturated region around the metal copper, so that plating defects can be avoided without applying high oxidative decomposition action to the entire plating bath in the plating tank and causing excessive oxidative decomposition of even useful organic additives around the cathodes (workpieces). The use of such anti-spreading means for air bubbles is also excellent in that impurities which may be formed as a result of dissolution of metal copper, such as slime, can be prevented from spreading by holding the impurities inside the anti-spreading means for air bubbles.

Figure 1B:
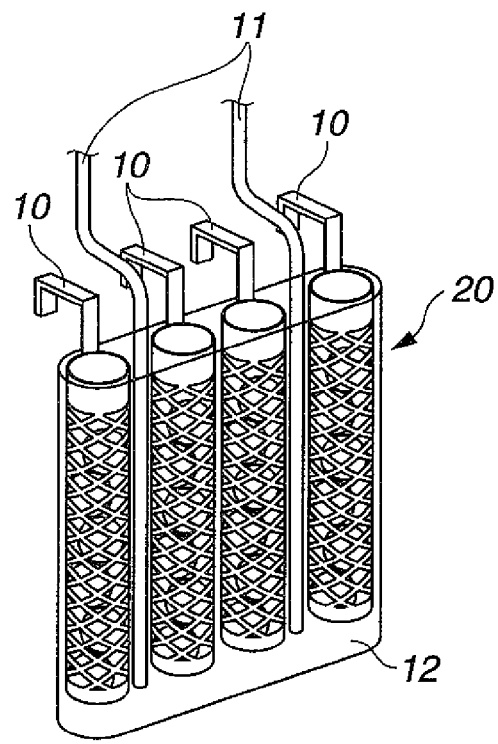

Examples of means for immersing metal copper are illustrated in FIGS. 1A and 1B, respectively. FIG. 1A shows a metal copper-receptacle assembly 10 with metal copper (metal copper balls) 1 held in a meshed receptacle 2 formed of a material free from dissolution or corrosion in a plating bath, for example, titanium or the like. The receptacle 2 is provided at a top part thereof with an L-shaped hook 3 formed such that the receptacle 2 can be hung on a wall of a plating bath to be described subsequently herein. FIG. 1B depicts an oxidative decomposition unit 20, in which four metal copper-receptacle assemblies 10 are integrated together as a unit (it is to be noted that the number of integrated metal copper-receptacle assemblies is not limited to four and that only one metal copper-receptacle assembly may be used or two, three, five or more metal copper-receptacle assemblies may be integrated together) and two air nozzles 11 are each arranged between every two adjacent ones of the metal copper-receptacle assemblies 10 (it is to be noted that no limitation is imposed on the number of air nozzles and that one, three or more air nozzles may be arranged). In the example of FIG. 1B, the four metal copper-receptacle assemblies 10 and two air nozzles 11 are fixedly secured to the copper-receptacle assemblies 10 by unillustrated fixing means in anti-spreading means 12 for air bubbles, such as a meshed bag (a meshed basket in this example), formed of a material free from dissolution or corrosion in the plating bath (for example, made of polypropylene). The four metal copper-receptacle assemblies 10 and two air nozzles 11 are surrounded by the anti-spreading means 12 for air bubbles such that they are isolated for air bubbles while allowing the plating bath to move both inside and outside the anti-spreading means 12 for air bubbles.

Figure 2:
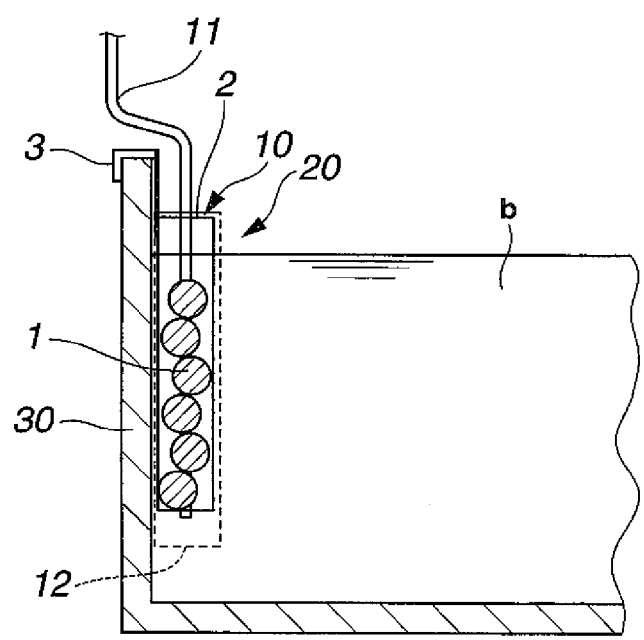
FIG. 2 is a fragmentary cross-sectional view illustrating one example of a state of metal copper immersed in a plating bath by the oxidative decomposition unit.

The oxidative decomposition unit 20 can be suspended in a plating bath 30 to immerse the metal copper 1 in a plating bath b, for example, by hanging the hooks 3 of the metal copper-receptacle assemblies 10 on an upper part of a side wall of the plating bath 30 as illustrated in FIG. 2. Using a flow rate control unit (for example, a valve, flow meter or the like although it is not shown), a predetermined amount of air is blown out through the air nozzles 11 from points below the metal copper 1 such that air bubbles are fed to neighborhoods of the metal copper 1 and are brought into contact with the metal copper 1. The oxidative decomposition unit 20 is provided with the anti-spreading means 12 for air bubbles to prevent air bubbles from flowing out of the oxidative decomposition unit 20.

To prevent the air bubbling for the metal copper from affecting the plating, the metal copper is immersed in a region other than a plating zone (i.e., a zone to which electrochemical action in electroplating is directly applied, especially a zone between the anode and the cathodes). It is more preferred to immerse the metal copper in a region other than a conveyance path for the cathodes (workpieces). Specifically, the metal copper can be immersed, for example, as shown in FIGS. 3 to 6.

Figure 3:
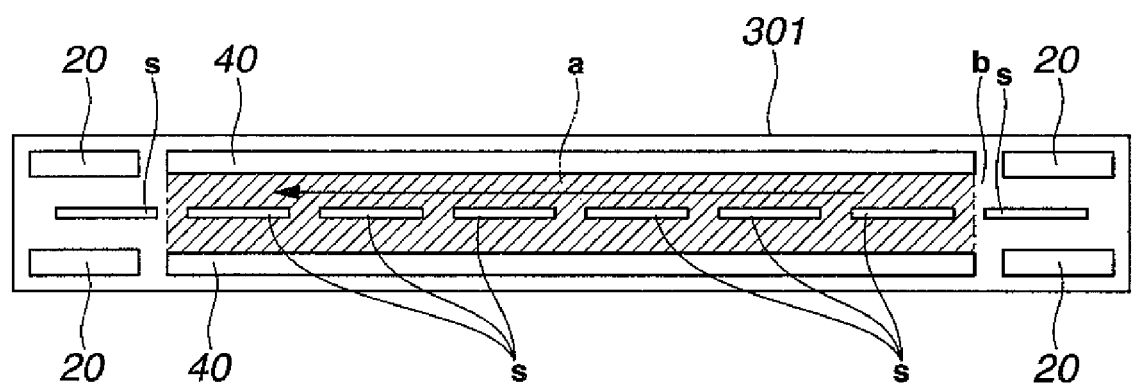
FIG. 3 is a schematic plan view showing illustrative immersion positions of oxidative decomposition units, which are equipped with metal copper, in a vertical, continuous-conveyance plating tank.

FIG. 3 depicts an illustrative vertical, continuous-conveyance plating tank. Along a moving direction of workpieces s (in the direction of an arrow in the figure), two insoluble anodes 40 are arranged such that they oppose front and rear sides of the workpieces (cathodes) s, respectively. In FIG. 3, zones between the respective anodes 40 and the cathodes s are designated by letter a. In this example, four oxidative decomposition units 20 are arranged in total, two being located lateral to one ends of the respective insoluble anodes 40 as viewed in a moving direction of the workpieces s and the remaining two being located lateral to opposite ends of the respective insoluble anodes 40, and all being located off the conveyance path for the cathodes (workpieces) s. These locations correspond to regions where no bipolar phenomenon occurs.

Figure 4:
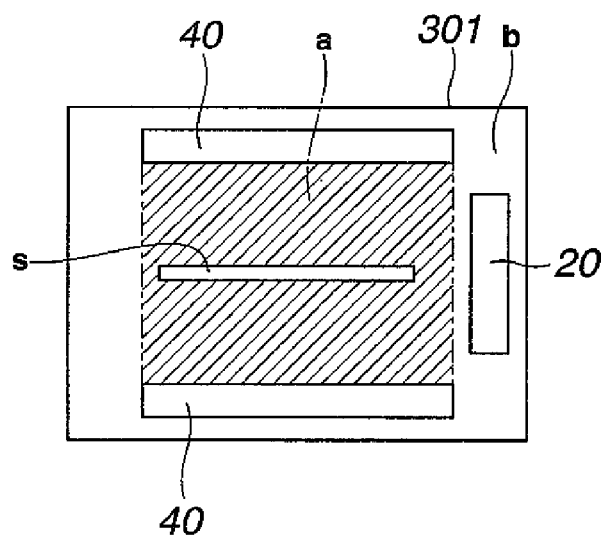
FIG. 4 is a schematic plan view depicting an illustrative immersion position of an oxidative decomposition unit, which is equipped with metal copper, in a dip plating tank.

FIG. 4 depicts an illustrative dip plating tank. Two insoluble anodes 40 are arranged such that they oppose front and rear sides (sides to be plated) of a workpiece (cathode) s, respectively. In FIG. 4, zones between the respective anodes 40 and the cathode s are designated by letter a. In this example, a single oxidative decomposition unit 20 is arranged lateral to one ends of the two anodes 40 as viewed in a horizontal direction. Its installation location corresponds to a region where no bipolar phenomenon occurs.

Figure 5:
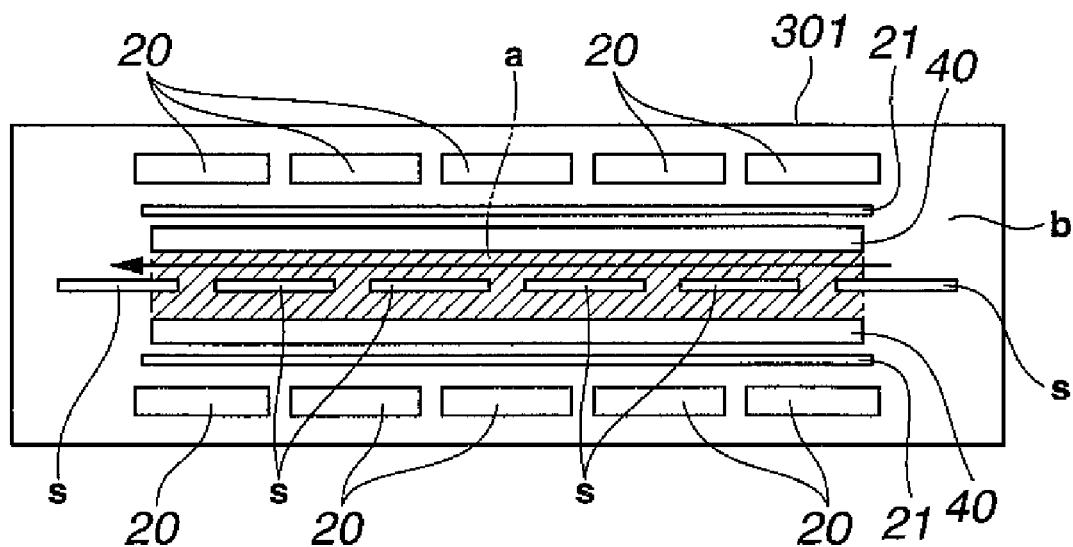
FIG. 5 is a schematic plan view showing illustrative immersion positions of other oxidative decomposition units, which are equipped with metal copper, in a vertical, continuous-conveyance plating tank.

FIG. 5 shows another illustrative vertical, continuous-conveyance plating tank, which is different from the example of FIG. 3 in the locations of oxidative decomposition units 20. In FIG. 5, zones between two insoluble anodes 40 and cathodes s are designated by letter a. In this example, the oxidative decomposition units 20 are arranged as many as ten (10) in total, five of them being located between a back side of each of the insoluble anodes 40, the back side being opposite to a side facing the cathodes s, and an opposite wall of the plating tank, respectively. Further, shield plates 21 are arranged between the respective oxidative decomposition units 20 and their opposite anodes 40 and cathodes s to inhibit a bipolar phenomenon which would otherwise be induced because the oxidative decomposition units 20 are located close to the anodes 40 and cathodes (workpieces) s.

Figure 6:
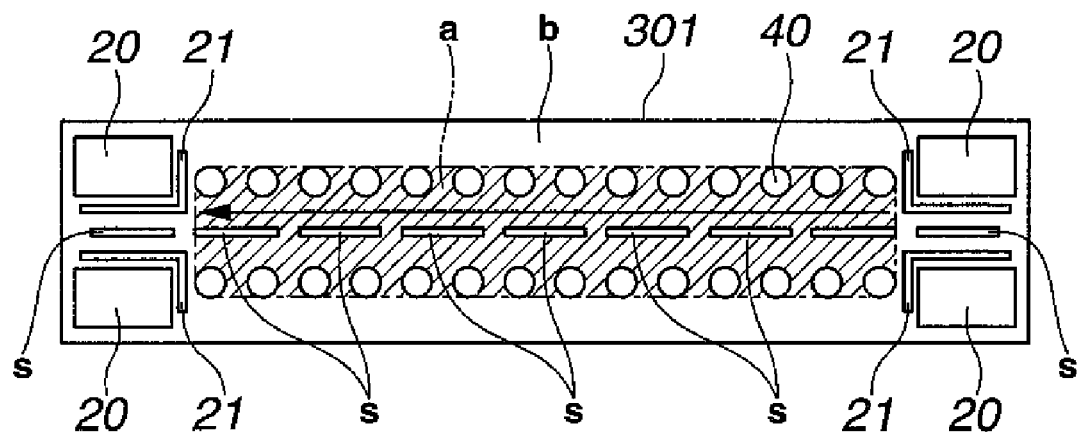
FIG. 6 is a schematic plan view depicting illustrative immersion positions of further oxidative decomposition units, which are equipped with metal copper, in a vertical, continuous-conveyance plating tank.

FIG. 6 depicts a further illustrative vertical, continuous-conveyance plating tank, which is different from the example of FIG. 3 in the shape and number of insoluble anodes 40. In FIG. 6, zones between the insoluble cylindrical anodes 40 and cathodes (workpieces) s are designated by letter a. In this example, four (4) oxidative decomposition units 20 are arranged in total, two of them being located lateral to one ends of the insoluble cylindrical anodes 40 as viewed in a traveling direction of the workpieces s, the remaining two oxidative decomposition units 20 being located lateral to opposite ends of the insoluble cylindrical anodes 40 as viewed in the traveling direction of the workpieces s, and all being located off the conveyance path for the cathodes (workpieces) s. Further, shield plates 21 are arranged between the respective oxidative decomposition units 20 and their opposite anodes 40 and cathodes s to inhibit a bipolar phenomenon which would otherwise be induced because the oxidative decomposition units 20 are located close to the anodes 40 and cathodes (workpieces) s. It is to be noted that in each of FIGS. 3 through 6, numeral 301 indicates a main plating tank and letter b designates a plating bath. In each of the above examples, the metal copper (oxidative decomposition units) are arranged in the main plating tank by way of example. The metal copper (oxidative decomposition units) can, however, be arranged in an overflow tank.

In the present invention, the surface of the immersed metal copper and its peripheral region, specifically the region surrounded by the anti-spreading means for air bubbles is used as an oxidative decomposition region, and air bubbling is applied to the oxidative decomposition region at a rate of 0.01 L/min or higher, notably at a rate of from 0.1 to 2 L/min per the unit immersed area (i.e., 0.01 L/dm$^2$·min or higher, notably from 0.1 to 2 L/dm$^2$·min). By this air bubbling, decomposed/modified organic products formed as a result of decomposition or modification of organic additives by their oxidation or reduction reactions upon electrolytic copper plating are oxidatively decomposed on the surface of the metal copper by a non-electrolytic oxidizing action independent from a current impressed between the anode and the cathodes while allowing the metal copper to dissolve as copper ions.

Although not intended to specifically limit the mechanism of this decomposing action, it is presumed that the decomposed/modified organic products are adsorbed on the metal copper in such a state as the concentration of dissolved oxygen at the surface of the metal copper is saturated and that the thus-adsorbed decomposed/modified organic products are oxidatively decomposed under catalytic action of the metal copper (or copper oxide formed by oxidation of its surface) upon dissolution of the decomposed/modified organic products together with the metal copper. Theoretically, this decomposing action can be made more effective by increasing the immersed area of the metal copper and raising the rate of air bubbling. From the standpoint of avoiding excessive dissolution of the metal copper, however, it is desired to control the immersed area of the metal copper and the rate of air bubbling to prevent especially defective copper fills, which would otherwise take place by an excessive rise in the concentration of copper in a plating bath, particularly when high productivity is sought by continuously using a plating bath after its initial make-up.

According to the present invention, a plating bath can be continuously used, for example, over 20 days or longer after its initial make-up without any interruption to perform plating (in other words, higher productivity is available), and the plating bath can be used continuously further while replenishing components as needed. In conventional electroplating processes, it is necessary to periodically stop the plating or to perform dummy plating such that the performance of a plating bath can be restored. In the present invention, however, plating can be performed over a long term without needing such stoppage or dummy plating.

In the present invention, the surface of the immersed metal copper and its peripheral region, specifically the region surrounded by the anti-spreading means for air bubbles is used as an oxidative decomposition region, and concentrating on the oxidative decomposition region, air bubbling is applied at a predetermined rate such that copper can be dissolved at the above-described predetermined rate. It is, therefore, possible to bring the quantity of dissolved oxygen in the oxidative decomposition region to a level closed to its saturation. Accordingly, the dissolved oxygen in the plating bath can be more effectively used for oxidative decomposition reactions. In this respect too, the above-mentioned anti-spreading means for air bubbles functions particularly effective.

Even if the copper ions formed by the dissolution of the metal copper are cuprous ions ($Cu^+$) which deleteriously affects the characteristics of plating, such monovalent copper ions are immediately oxidized into cupric ions ($Cu^{2+}$) in the atmosphere saturated with dissolved oxygen. Therefore, effects of monovalent copper ions are not much in the present invention.

Plating can be continued by replenishing components of the copper sulfate plating bath, the components having decreased as a result of continuous electrolytic copper plating, in a conventionally-known manner, for example, by adding replenishing solutions as needed. Further, in the case of a soluble anode, copper ions needed for plating can be replenished from the soluble anode. When an insoluble anode is used, on the other hand, a separate tank can be arranged in addition to the plating tank, and copper ions needed for plating can be fed to the separate tank to replenish copper ions from the separate tank into the plating tank. Described specifically, copper ions can be replenished by dissolving copper oxide (CuO) with air agitation, mechanical agitation and/or the like in the separate tank, and subsequent to completion of the dissolution, stopping the air bubbling and the like and circulating the plating bath between the separate tank and the plating tank.

Figure 7:
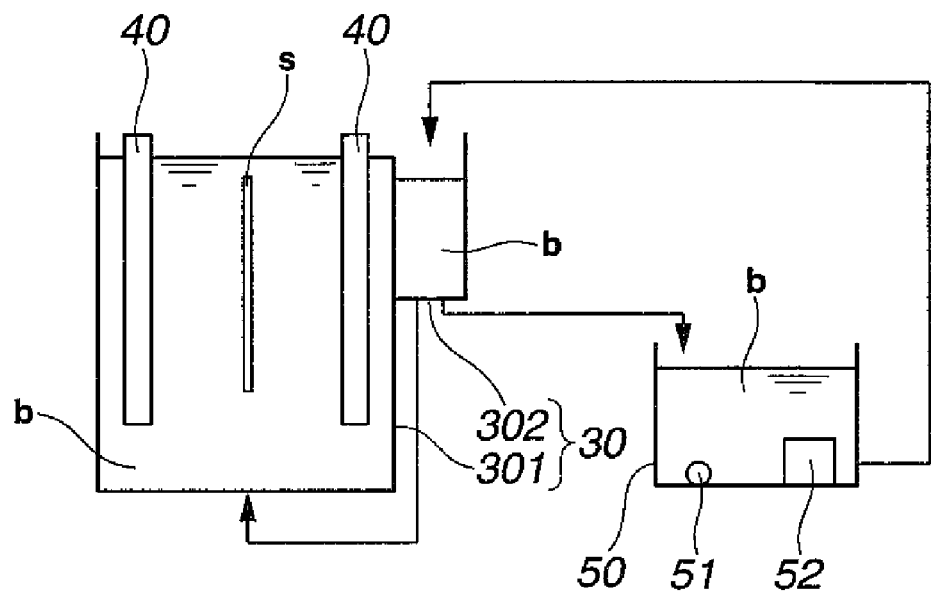
FIG. 7 is a simplified construction diagram of a plating system for describing a method that replenishes copper ions by arranging a separate tank.

FIG. 7 illustrates an outline of a feeding method of copper ions, which are needed for plating, between a plating tank 30 and a separate tank 50. The plating tank 30 includes a main plating tank 301 and an overflow tank 302. For example, with circulation (a circulation pump (not shown)) between the plating tank 30 and the separate tank 50 being kept stopped, copper oxide is charged in the separate tank 50 to dissolve it there. In this example, the dissolution of the copper oxide is promoted by an air agitator 51 and a mechanical agitator 52. After completion of the dissolution of the copper oxide in the separate tank 50, the air agitator 51 and mechanical agitator 52 are stopped. Subsequent to the elapse of a predetermined time until air bubbles become no longer existing in a plating bath b in the separate tank 50, various organic additives and the like are replenished as much as needed, and the circulation pump (not shown) is operated to initiate circulation of the plating bath b between the plating tank 30 (overflow tank 302) and the separate tank 50 so that into the plating tank, copper ions are fed as much as needed for plating. It is to be noted that in FIG. 7, numeral 40 designated anodes and letter s indicates a workpiece (cathode).

In the above-described example, it is also preferred to arrange two overflow tanks in communication with each other, to set one of the overflow tanks as a tank for drawing the plating bath out of the plating tank on the side of feeding the plating bath to the separate tank, to set the other overflow tank as a tank for returning the plating bath on the side of feeding the plating bath from the separate tank to the plating tank, and to transfer the plating bath from the other overflow tank to the main plating tank for its circulation.

In the present invention, the plating temperature may suitably be from 20 to 30° C. in general. For the agitation of the plating bath itself, it is preferred to use conventional plating bath agitation means, for example, a jet flow agitation or circulation agitation making use of a pump, or a mechanical agitation such as a paddle or cathode rocking, because the agitation of the plating bath in the plating tank makes efficient the transfer of decomposed/modified organic products to the oxidative decomposition region, replaces the plating bath in the oxidative decomposition region, and hence renders the action of oxidative decomposition more efficient. It is also preferred to apply air agitation to each workpiece in addition to the above-mentioned agitation. It is an object of the air agitation for each workpiece to promote the replacement of the plating bath at the surface of the workpiece and hence to inhibit defective plating or a defective plating fill. As mentioned above, air agitation for each workpiece is applied for the object different from the action of oxidative decomposition of decomposed/modified organic products. As a current is applied to each workpiece as a cathode, metal copper deposits on the workpiece under an electroplating action. However, the thus-deposited metal copper is practically not considered to dissolve and to produce an oxidatively decomposing action on the decomposed/modified organic products.

The present invention can be applied to electrolytic copper plating that forms a wiring pattern or the like on a printed circuit board, wafer or the like as a workpiece, especially on a printed circuit board, wafer or the like having at least structures, such as blind vias or trenches, in which electrolytic copper plating is filled to form buried wirings. The present invention can also be applied to an electrolytic copper plating process that subsequent to advance adsorption of one of organic additives on each workpiece by predipping, the organic additives being contained in a copper sulfate plating bath, performs electrolytic copper plating in the copper sulfate plating bath which either contains or does not contain the adsorbed organic additive.

EXAMPLES

The present invention will hereinafter be specifically described based on Examples and Comparative Examples, although the present invention shall not be limited to the following Examples.

Example 1

As workpieces to be plated, printed circuit boards having blind vias of 80 μm diameter and 35 μm depth were provided. After conventionally-known pretreatment, catalyst treatment and chemical copper plating were applied to the printed circuit boards, electrolytic copper plating was continuously applied under the below-described conditions for running plating in the below-described copper sulfate plating bath by changing the circuit boards one after one. As oxidative decomposition units, unit similar to that shown in FIG. 1B were used by arranging them at the positions depicted in FIG. 3. During the electrolytic copper plating, various components were measured by known concentration analysis methods. Copper ions were replenished by dissolving copper oxide in the separate tank 50 shown in FIG. 7 and circulating the plating bath to the plating tank 30 by a pump, and other components were replenished to the overflow tank 302 as much as needed. In the electrolytic copper plating bath, continuous electrolytic copper plating was performed by changing conditions, and to determine the conditions of the plating bath, assessment plating to blind vias was performed once a day. In the assessment plating, assessment plating conditions were set equal to accurately ascertain the conditions of the plating bath. It is to be noted that the volume of the plating bath contained in the main plating bath 301 and overflow bath 302 was set at 200 L and the plated area of each workpiece immersed in the plating bath was set at 50 dm². The assessment results of plating fillability for blind vias are presented in Table 1.

| [Copper sulfate plating bath] | |
|---|---|
| Copper sulfate pentahydrate: | 200 g/L |
| Sulfuric acid: | 50 g/L |
| Chlorine: | 50 mg/L |
| Quaternary amine compound: | 10 mg/L |
| Bis(3-sulfopropyl) disulfide (disodium salt) (SPS): | 5 mg/L |
| PEG: | 500 mg/L |

| [Conditions for running plating] | |
|---|---|
| Plating time per board: | 60 min (plating time was set to give a 20 μm thick plating film as a surface pattern wiring other than the blind vias) |
| Bath current density (A/L): | As presented in the table |
| Immersed area of metal copper (dm²/L): | As presented in the table |
| Air bubbling rate (L/(dm² · min)): | As presented in the table |
| Anode: | Insoluble anode ("PLATINODE ™ 187" (Mesh: N type), product of Umicore Galvanotechnik GmbH) |

Circulation agitation of the plating bath and air agitation for the workpieces were conducted.

| [Conditions for assessment plating (plating conditions for blind vias)] | |
|---|---|
| Current density: | 1.5 A/dm² |
| Plating time: | 60 min (plating time was set to give a 20 μm thick plating film as a surface pattern wiring other than the blind vias) |

[Assessment Method]

Each blind via was assessed for any dimple as viewed in cross-section. Blind vias were assessed "disapproved" when the depth of a dimple was 10 μm or greater, while blind vias were assessed "approved" when the depth of a dimple was smaller than 10 μm.

Example 2

Electrolytic copper plating was performed in a similar manner as in Example 1 except that the anode was changed to a soluble anode (phosphorus-containing copper balls held in a Ti-made basket and covered by a polypropylene-made bag). Plating fillability for blind vias was assessed as in Example 1. The results are presented in Table 1.

Comparative Example 1

Figure 8:
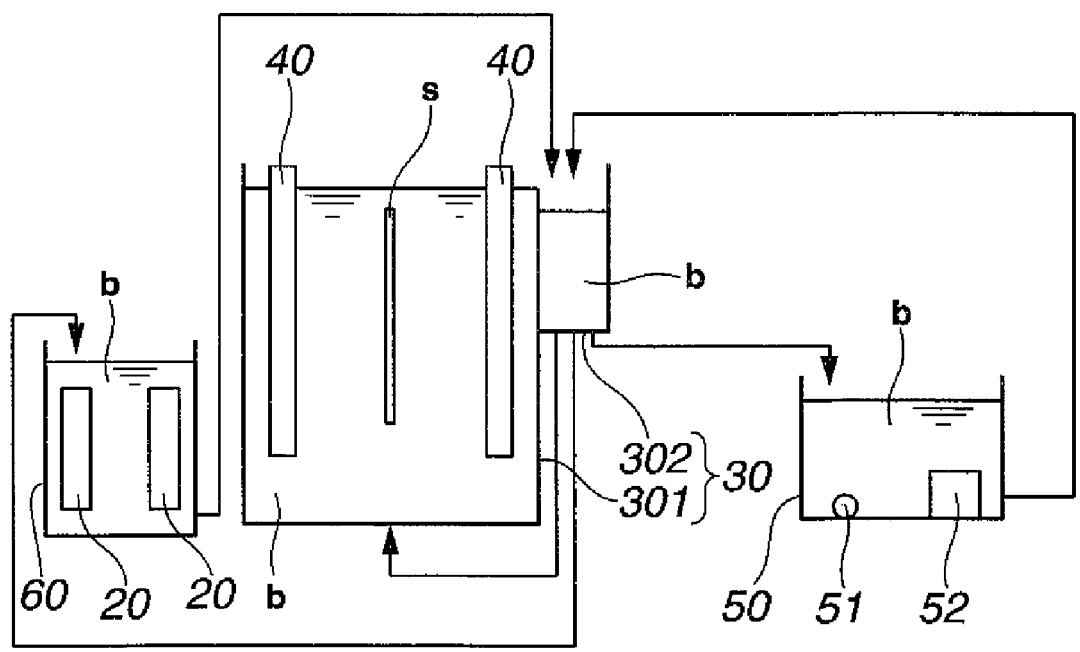
FIG. 8 is a simplified construction diagram of a plating system, which is equipped with a decomposition tank in addition to a plating tank and was employed in comparative examples.

Electrolytic copper plating was performed in a similar manner as in Example 1 except that an electroplating system equipped with a decomposition tank separately from a main plating tank, such as that shown in FIG. 8, was used as an electroplating system, oxidation decomposition units were immersed under air agitation in the decomposition tank, and the total immersed area of metal copper was employed as an immersed area per total volume of the plating bath in the electroplating tank, decomposition tank and separate tank. Plating fillability for blind vias was assessed as in Example 1. The results are presented in Table 1. It is to be noted that in FIG. 8, numeral 20 indicates the oxidative decomposition units and numeral 60 designates the decomposition tank. Other elements are indicated by like reference numerals and letters as in FIG. 7, and their description is omitted herein.

Comparative Example 2

Electrolytic copper plating was performed in a similar manner as in Comparative Example 1 except that the total immersed area of metal copper and the air bubbling rate were changed as presented in Table 1. Plating fillability for blind vias was assessed as in Example 1. The results are presented in Table 1.

Comparative Example 3

Electrolytic copper plating was performed in a similar manner as in Comparative Example 1 except that no oxidative decomposition units were used and no air bubbling was applied. Plating fillability for blind vias was assessed as in Example 1. The results are presented in Table 1.

TABLE 1

| | Example | | Comparative Example | | |
|---|---|---|---|---|---|
| | 1 | 2 | 1 | 2 | 3 |
| Bath current density (A/L) | 0.42 | 0.42 | 0.42 | 0.42 | 0.42 |
| Immersed area (dm²/L) | 0.02 | 0.02 | 0.02 | 0.5 | 0 |
| Air bubbling rate (L/(dm² · min)) | 0.2 | 0.2 | 0.2 | 0 | 0 |
| Assessment results | Approved for 20 days | Approved for 20 days | Disapproved on the 5th day | Disapproved on the 7th day | Disapproved on the 3rd day |

From a comparison between Example 1 and Comparative Example 3, it is understood that the time at which the assessment results became "disapproved" was earlier in Comparative Example 3. This can be attributed presumably to deleterious effects of decomposed/modified organic products on the plating fillability for blind vias. Comparative Example 1 are the same as Example 1 in the total immersed area of metal copper based on the volume of the plating bath and the air bubbling rate were the same, but are different from Example 1 in that the oxidative decomposition of decomposed/modified organic products was conducted outside the plating tank in Comparative Example 1. From a comparison between Example 1 and Comparative Example 1, the importance of control of electrolytic copper plating based on the plating environment in a plating tank is appreciated. In Comparative Example 2, despite the large total immersed area of metal copper in Comparative Example, the oxidative decomposition of decomposed/modified organic products was insufficient due to the omission of air bubbling. Plating fillability remained stable over a longer period in Example 1. From these, it is understood that the oxidative decomposition of decomposed/modified organic products in a plating tank is reliable and effective for maintaining good plating fillability.

Examples 3 to 5

Electrolytic copper plating was performed in a similar manner as in Example 1 except that the bath current density (in those examples, the plated area was not fixed at 50 dm² but the bath current density was used as an index) and the total immersed area of metal copper and the air bubbling rate were changed as presented in Table 2. Plating fillability for blind vias was assessed as in Example 1. The results are presented in Table 2.

Example 6

Electrolytic copper plating was performed in a similar manner as in Example 1 except that a tertiary amine compound was used in place of the quaternary amine compound. Plating fillability for blind vias was assessed as in Example 1. The results are presented in Table 2.

Example 7

Electrolytic copper plating was performed in a similar manner as in Example 5 except that the anode was changed to a soluble anode (phosphorus-containing copper balls held in a Ti-made basket and covered by a polypropylene-made bag). Plating fillability for blind vias was assessed as in Example 1. The results are presented in Table 2.

TABLE 2

|  | Example | | | | |
| --- | --- | --- | --- | --- | --- |
|  | 3 | 4 | 5 | 6 | 7 |
| Bath current density (A/L) | 0.01 | 0.8 | 2 | 0.42 | 2 |
| Immersed area (dm²/L) | 0.002 | 0.03 | 0.5 | 0.02 | 0.5 |
| Air bubbling rate (L/(dm² · min)) | 0.2 | 0.2 | 0.2 | 0.2 | 0.2 |
| Assessment results | Approved for 20 days | Approved for 20 days | Approved for 20 days | Approved for 20 days | Approved for 20 days |

From the assessment results of Examples 3-5 and 7, it is understood that good plating fillability can be stably maintained over a long term even when the bath current density is varied by changing the anode current density and plated area in various ways. It is also appreciated from Example 6 that good plating fillability can be maintained over a long term even when a tertiary amine is used as an organic additive.

Comparative Examples 4 to 6

Electrolytic copper plating was performed in a similar is manner as in Example 1 except that the bath current density, the total immersed area of metal copper and the air bubbling rate were changed as presented in Table 3. Plating fillability for blind vias was assessed as in Example 1. The results are presented in Table 3.

Comparative Example 7

Electrolytic copper plating was performed in a similar manner as in Example 2 except that the bath current density, the total immersed area of metal copper and the air bubbling rate were changed as presented in Table 3. Plating fillability for blind vias was assessed as in Example 1. The results are presented in Table 3.

TABLE 3

|  | Comparative Example | | | |
| --- | --- | --- | --- | --- |
|  | 4 | 5 | 6 | 7 |
| Bath current density (A/L) | 6 | 0.42 | 0.42 | 0.42 |
| Immersed area (dm²/L) | 0.05 | 0.0005 | 0.02 | 0.02 |
| Air bubbling rate (L/(dm² · min)) | 0.2 | 0.2 | 0 | 0 |
| Assessment results | Disapproved on the 8th day | Disapproved on the 6th day | Disapproved on the 3rd day | Disapproved on the 3rd day |

Japanese Patent Application No. 2007-207440 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An electrolytic copper plating process for electroplating copper on a plurality of workpieces in a copper sulfate plating bath containing copper sulfate and an organic additive therein in a vertical, continuous-conveyance plating tank wherein a plurality of soluble or insoluble anodes are used, and said workpieces are used as cathodes, comprising the steps of:

immersing oxidative decomposition units including metal copper in an unpowered state in a region of said copper sulfate plating bath in said plating tank in which the anodes and the workpieces are immersed, said region being apart from a region between said anodes and said cathodes, such that a neighborhood of the thus-immersed metal copper is used as an oxidative decomposition region, wherein the anodes are arranged along a moving direction of the workpieces such that the anodes oppose front and rear sides of the workpieces, the oxidative decomposition units including said metal copper are arranged such that a part of the oxidative decomposition units is located lateral to one end of the anodes in a moving direction of the workpieces and the remainder of the oxidative decomposition units is located lateral to the opposite end of the anodes, said oxidative decomposition units are surrounded and isolated by anti-spreading means for air bubbles such that said copper sulfate bath is movable through said anti-spreading means for air bubbles, and said air bubbles are applied to said inside of said anti-spreading means for air bubbles; and shield plates are arranged between the oxidative decomposition units and the anodes so as to inhibit a bipolar phenomenon;

setting a current density at not higher than 5 A/L;

setting an immersed area of said metal copper at 0.001 to 1 $dm^2/L$ based on said plating bath; and applying air bubbling to said oxidative decomposition region at 0.01 to 2 $L/dm^2 \cdot min$ based on said immersed area, whereby said electroplating is performed while dissolving said metal copper as copper ions and also while subjecting on a surface of said metal copper a decomposed/modified organic product, which has been formed as a result of decomposition or modification by an oxidation or reduction reaction of said organic additive, to oxidative decomposition by a non-electrolytic oxidizing action independent from a current impressed between said anodes and said cathodes.

2. The electrolytic copper plating process according to claim 1, wherein said organic additive is at least one organic compound selected from a nitrogen-containing organic compound, a sulfur-containing organic compound or an oxygen-containing organic compound.

3. An electrolytic copper plating process for electroplating copper on a plurality of workpieces in a copper sulfate plating bath containing copper sulfate and an organic additive therein in a vertical, continuous-conveyance plating tank wherein a plurality of soluble or insoluble anodes are used and said workpieces are used as cathodes, comprising the steps of:

immersing oxidative decomposition units including metal copper in an unpowered state in a region of said copper sulfate plating bath in said plating tank in which the anodes and the workpieces are immersed, said region being apart from a region between said anodes and said cathodes, such that a neighborhood of the thus-immersed metal copper is used as an oxidative decomposition region, wherein the oxidative decomposition units including said metal copper are located between a back side of the anodes and an opposite wall of the plating tank, said oxidative decomposition units are surrounded and isolated by anti-spreading means for air bubbles such that said copper sulfate bath is movable through said anti-spreading means for air bubbles, and said air bubbles are applied inside said anti-spreading means for air bubbles, and shield plates are arranged between the oxidative decomposition units and the back side of the anodes so as to inhibit a bipolar phenomenon;

setting a current density at not higher than 5 A/L;

setting an immersed area of said metal copper at 0.001 to 1 $dm^2/L$ based on said plating bath; and applying air bubbling to said oxidative decomposition region at 0.01 to 2 $L/dm^2 \cdot min$ based on said immersed area, whereby said electroplating is performed while dissolving said metal copper as copper ions and also while subjecting on a surface of said metal copper a decomposed/modified organic product, which has been formed as a result of decomposition or modification by an oxidation or reduction reaction of said organic additive, to oxidative decomposition by a non-electrolytic oxidizing action independent from a current impressed between said anodes and said cathodes.

4. The electrolytic copper plating process according to claim 3, wherein said organic additive is at least one organic compound selected from a nitrogen-containing organic compound, a sulfur-containing organic compound or an oxygen-containing organic compound.

* * * * *